(12) United States Patent
Jang et al.

(10) Patent No.: US 10,879,074 B2
(45) Date of Patent: *Dec. 29, 2020

(54) METHOD OF FORMING SEMICONDUCTOR DEVICE AND SEMICONDUCTOR DEVICE

(71) Applicant: TAIWAN SEMICONDUCTOR MANUFACTURING CO., LTD., Hsinchu (TW)

(72) Inventors: Shu-Uei Jang, Hsinchu (TW); Chien-Hua Tseng, Hsinchu (TW); Chung-Shu Wu, Taoyuan (TW); Ya-Yi Tsai, Hsinchu (TW); Ryan Chia-Jen Chen, Hsinchu (TW); An-Chyi Wei, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/888,930

(22) Filed: Jun. 1, 2020

(65) Prior Publication Data

US 2020/0294804 A1    Sep. 17, 2020

Related U.S. Application Data

(63) Continuation of application No. 16/115,394, filed on Aug. 28, 2018, now Pat. No. 10,672,613.

(Continued)

(51) Int. Cl.
*H01L 21/28*     (2006.01)
*H01L 21/3105*   (2006.01)
(Continued)

(52) U.S. Cl.
CPC .. *H01L 21/28123* (2013.01); *H01L 21/02156* (2013.01); *H01L 21/02186* (2013.01);
(Continued)

(58) Field of Classification Search
CPC .......... H01L 29/0653; H01L 21/28123; H01L 21/31111; H01L 21/32139; H01L 29/7851; H01L 21/02156; H01L 21/02186; H01L 21/31055; H01L 29/66795; H01L 21/76224; H01L 21/823431;
(Continued)

(56) References Cited

U.S. PATENT DOCUMENTS

| 8,486,834 B2 | 7/2013 | Hsu et al. |
| 8,598,028 B2 | 12/2013 | Tu et al. |

(Continued)

*Primary Examiner* — Savitri Mulpuri
(74) *Attorney, Agent, or Firm* — Maschoff Brennan

(57) ABSTRACT

A method of forming a semiconductor device includes removing a top portion of a dielectric layer surrounding a metal gate to form a recess in the dielectric layer; filling the recess with a capping structure; forming a patterned hard mask over the capping structure and over the metal gate, wherein a portion of the metal gate, a portion of the capping structure, and a portion of the dielectric layer are aligned vertically with an opening of the patterned hard mask; and performing an etch process on said portions of the metal gate, the capping structure, and the dielectric layer that are aligned vertically with the opening of the patterned hard mask, wherein the capping structure has an etch resistance higher than an etch resistance of the dielectric layer during the etch process.

20 Claims, 15 Drawing Sheets

Related U.S. Application Data

(60) Provisional application No. 62/590,178, filed on Nov. 22, 2017.

(51) Int. Cl.
*H01L 21/311* (2006.01)
*H01L 21/3213* (2006.01)
*H01L 29/78* (2006.01)
*H01L 21/02* (2006.01)
*H01L 21/762* (2006.01)
*H01L 29/66* (2006.01)
*H01L 29/06* (2006.01)

(52) U.S. Cl.
CPC .. *H01L 21/31055* (2013.01); *H01L 21/31111* (2013.01); *H01L 21/31116* (2013.01); *H01L 21/32133* (2013.01); *H01L 21/32139* (2013.01); *H01L 21/76224* (2013.01); *H01L 29/0653* (2013.01); *H01L 29/66795* (2013.01); *H01L 29/7851* (2013.01); *H01L 29/66545* (2013.01)

(58) Field of Classification Search
CPC ......... H01L 21/31116; H01L 21/32133; H01L 29/66545
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 10,109,525 B1 | 10/2018 | Lu et al. |
| 10,157,790 B1 | 12/2018 | You et al. |
| 10,468,527 B2 | 11/2019 | Yang et al. |
| 2016/0104645 A1 | 4/2016 | Hung et al. |
| 2017/0133479 A1 | 5/2017 | Wang et al. |
| 2018/0033699 A1 | 2/2018 | Zhu |
| 2018/0286959 A1 | 10/2018 | Wang |
| 2018/0315618 A1 | 11/2018 | Huang et al. |
| 2018/0342420 A1 | 11/2018 | You et al. |
| 2018/0350662 A1 | 12/2018 | You |
| 2019/0006345 A1 | 1/2019 | Wang et al. |
| 2019/0164837 A1 | 5/2019 | Hung et al. |

METHOD OF FORMING SEMICONDUCTOR DEVICE AND SEMICONDUCTOR DEVICE

PRIORITY CLAIM AND CROSS-REFERENCE

This present application is a Continuation Application of U.S. patent application Ser. No. 16/115,394, filed on Aug. 28, 2018, now U.S. Pat. No. 10,672,613, issued on Jun. 2, 2020, which claims priority to U.S. Provisional Application Ser. No. 62/590,178, filed Nov. 22, 2017, which are herein incorporated by reference in their entirety.

BACKGROUND

Semiconductor devices are small electronic components that are fabricated on a semiconductor wafer substrate. Using a variety of fabrication techniques, these devices are made and connected together to form integrated circuits. A number of integrated circuits may be found on one chip, and are capable of performing a set of useful functions in the operation of an electronic appliance. Examples of such electronic appliances are mobile telephones, personal computers, and personal gaming devices. As the size of these popular devices would imply, the components formed on a chip are small.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
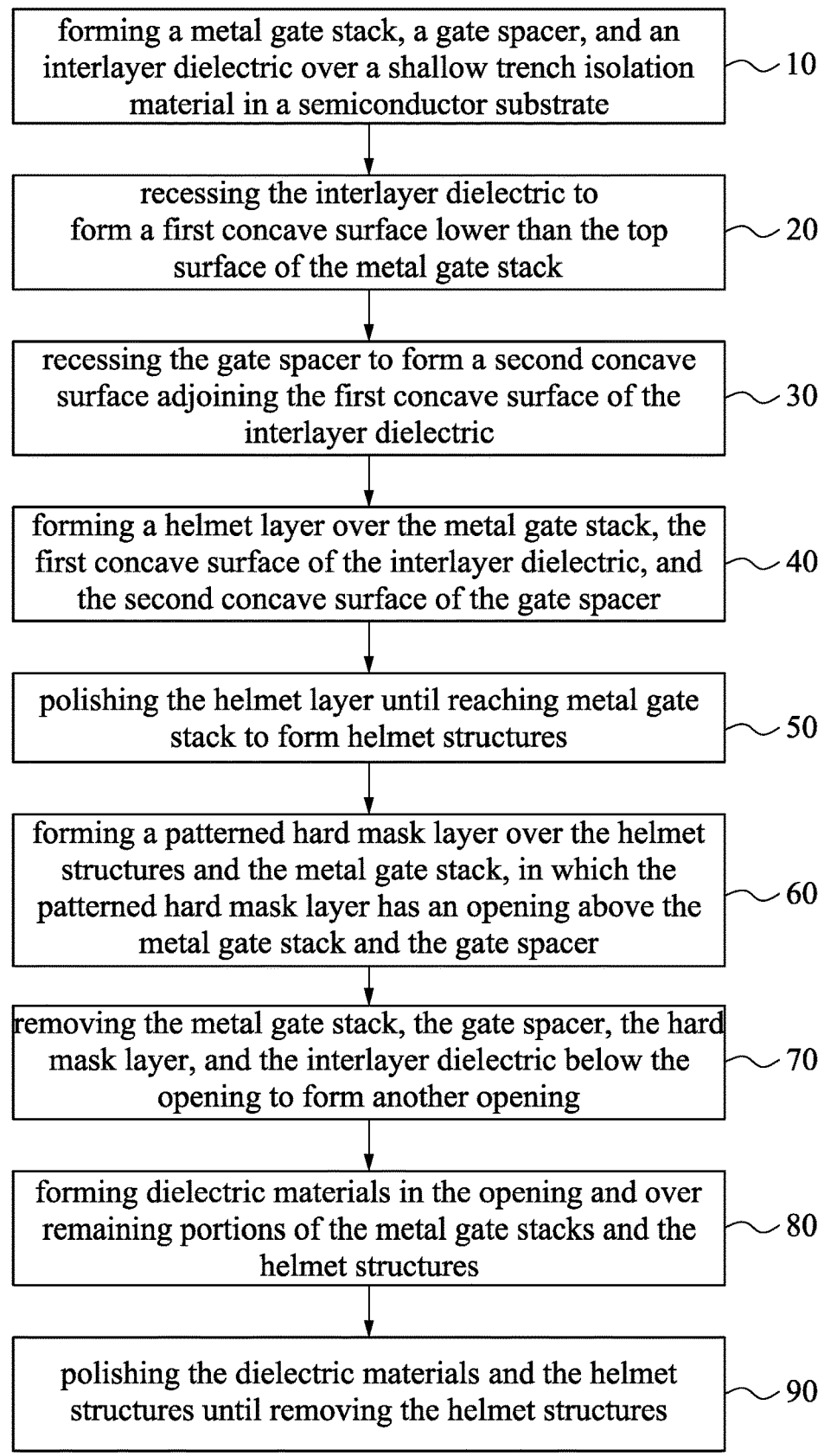
FIG. 1 is a flowchart of a method of forming a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The formation of a field-effect transistor (FinFET) includes forming a mask layer over a semiconductor substrate, patterning the mask layer to form openings that expose portions of the substrate, forming trenches in the substrate below the openings of the mask layer such that the fins are formed between the trenches, removing the remaining mask layer, forming a shallow trench isolation (STI) material in the trenches, recessing the STI material, forming dummy gate electrodes over the STI material and across the fins, forming gate spacers on sidewalls of the dummy gate electrodes, epitaxially growing a semiconductor material over upper portions of the fins, forming an interlayer dielectric (ILD) over the epitaxially-grown semiconductor material and the STI material, removing the dummy gate electrodes to form openings between the gate spacers, and forming metal gate stacks in the openings between the gate spacers. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2:
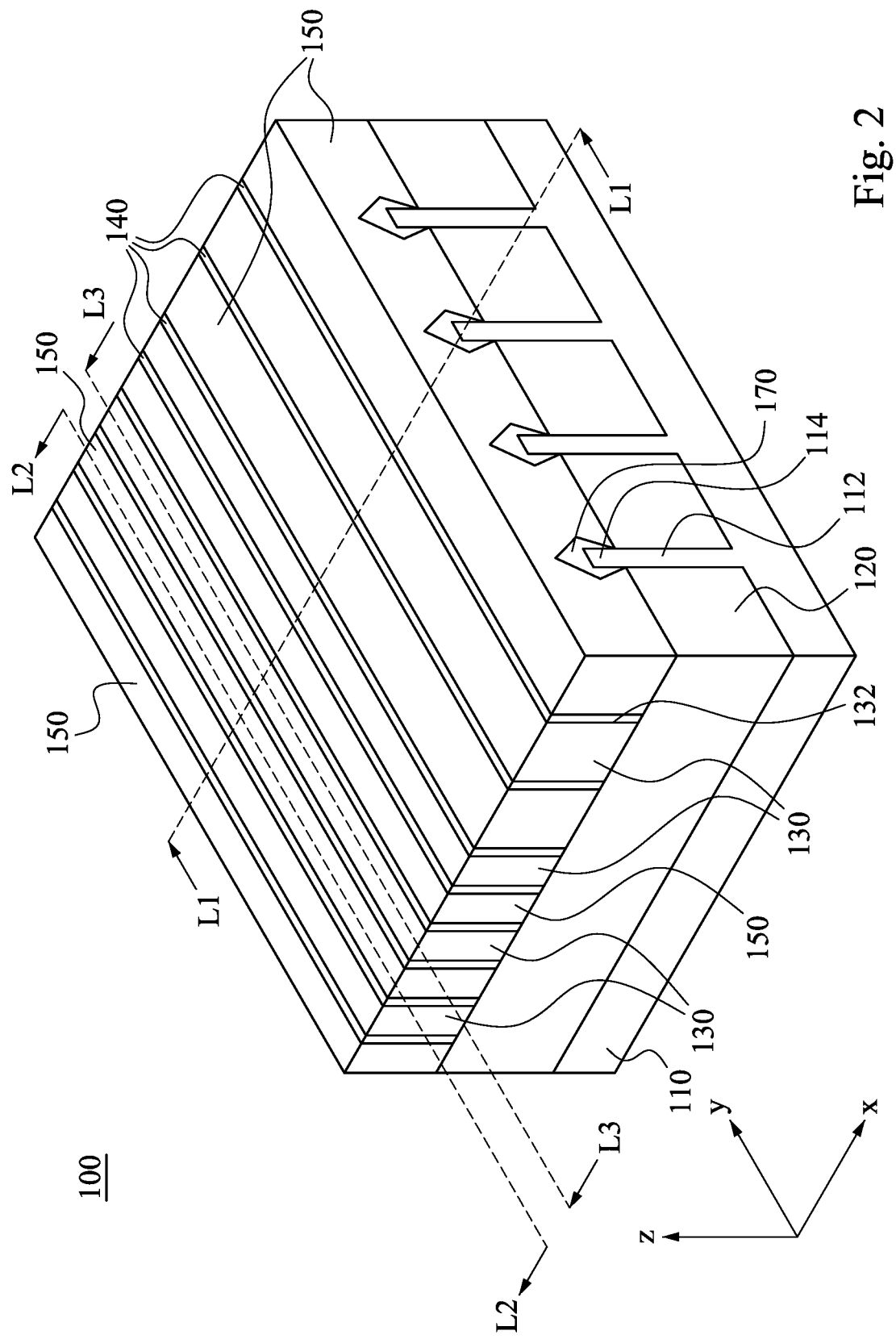
FIG. 2 is a perspective view of a semiconductor device in accordance with some embodiments of the present disclosure.
Figure 3:
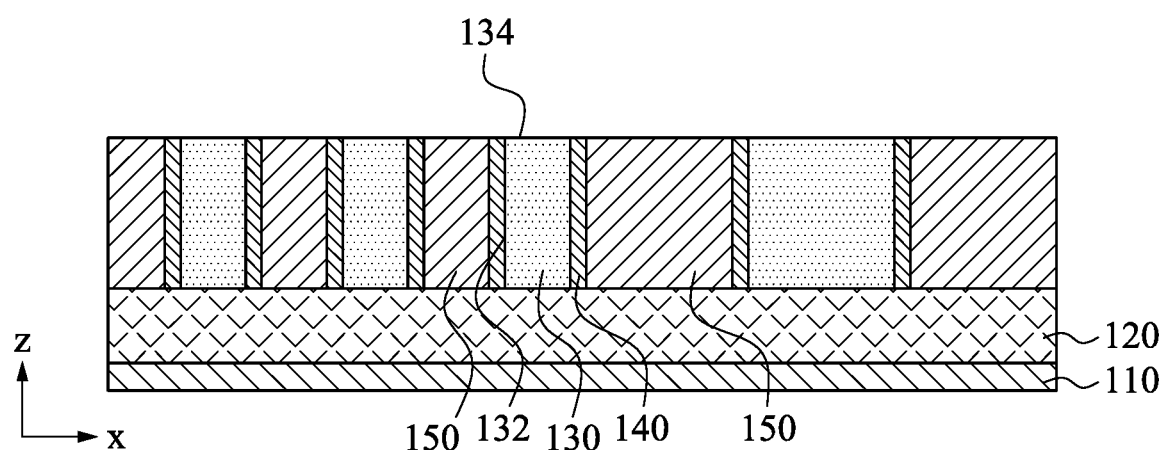
FIG. 3 is a cross-sectional view of the semiconductor device taken along line L1-L1 shown in FIG. 2.
Figure 4:
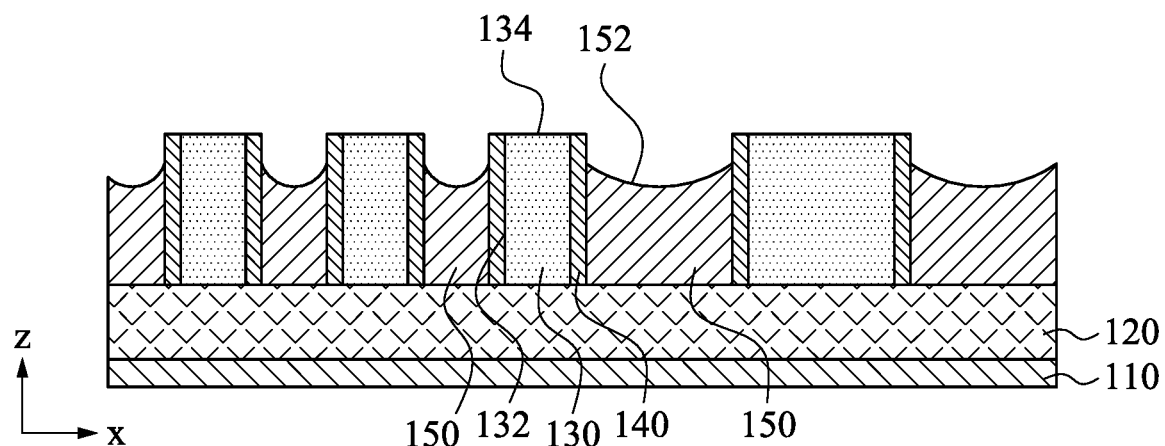
FIGS. 4-7, 9, 11, 13, 15, 17, 19, and 21 are cross-sectional views of intermediate stages of forming a semiconductor structure taken along line L1-L1 of FIG. 2 after the stage of FIG. 3.
Figure 5:
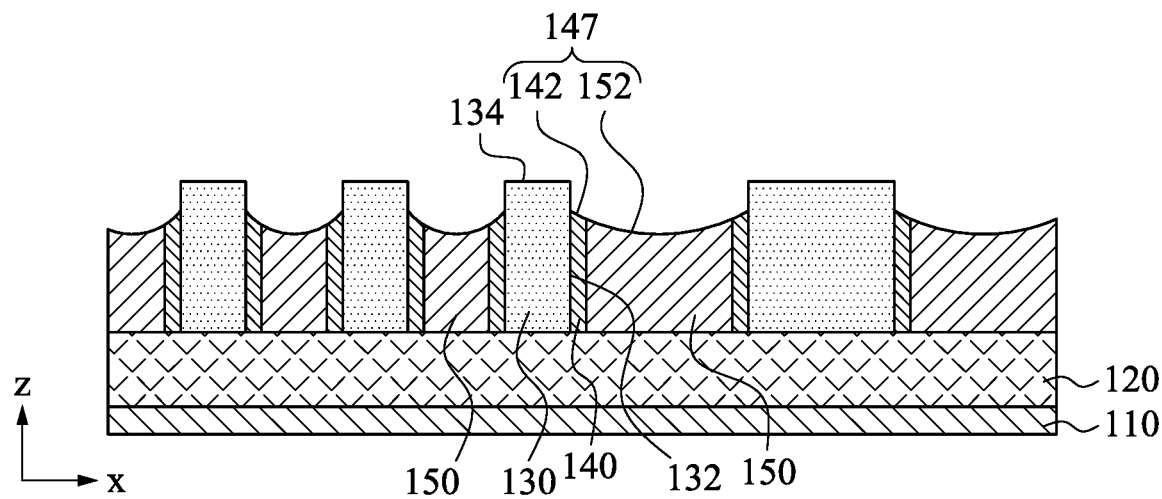
Figure 6:
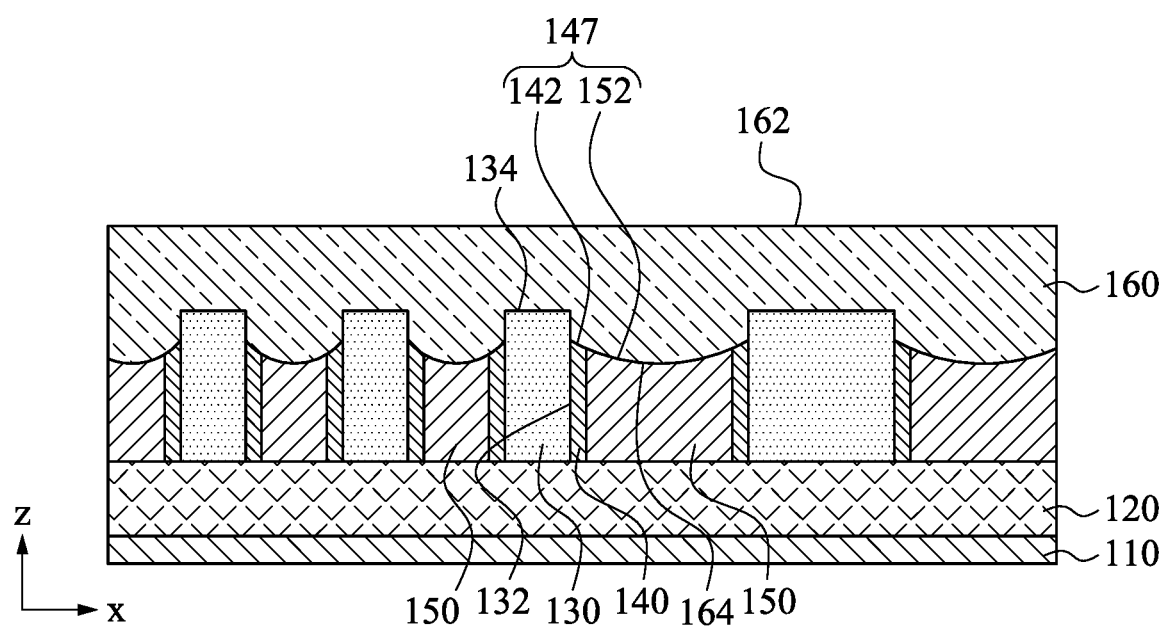
Figure 7:
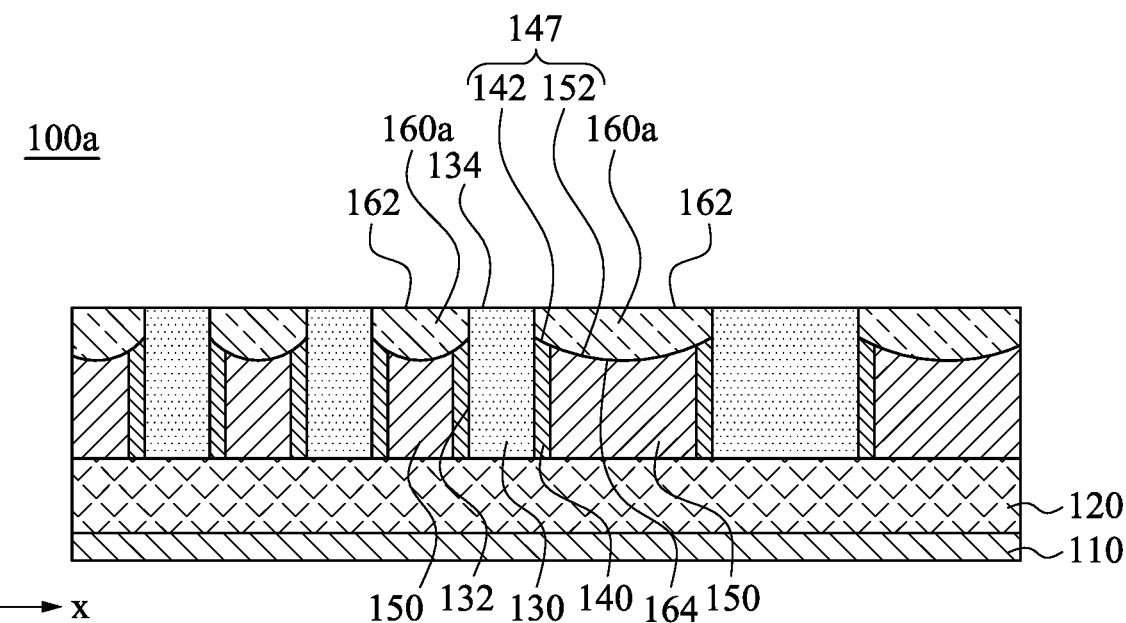
Figure 8:
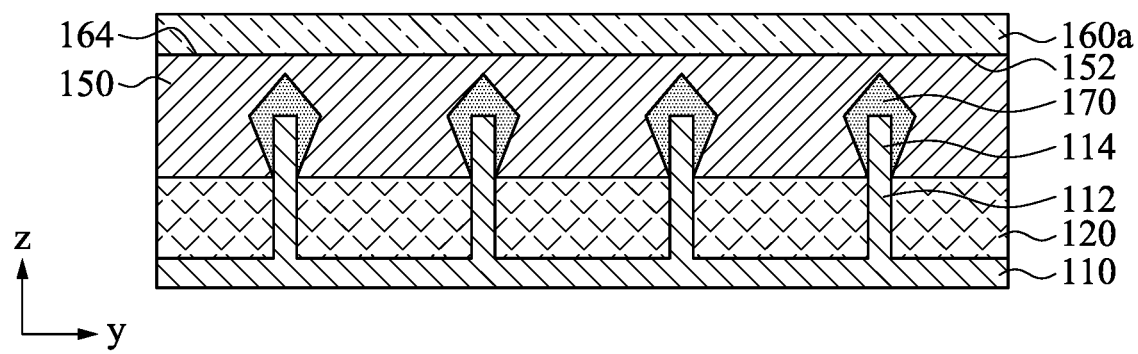
FIGS. 8, 10, 12, 14A, 16A, 18A, 20, and 22 are cross-sectional views of intermediate stages of forming a semiconductor structure taken along line L2-L2 of FIG. 2 after the stage of FIG. 6.
Figure 13:
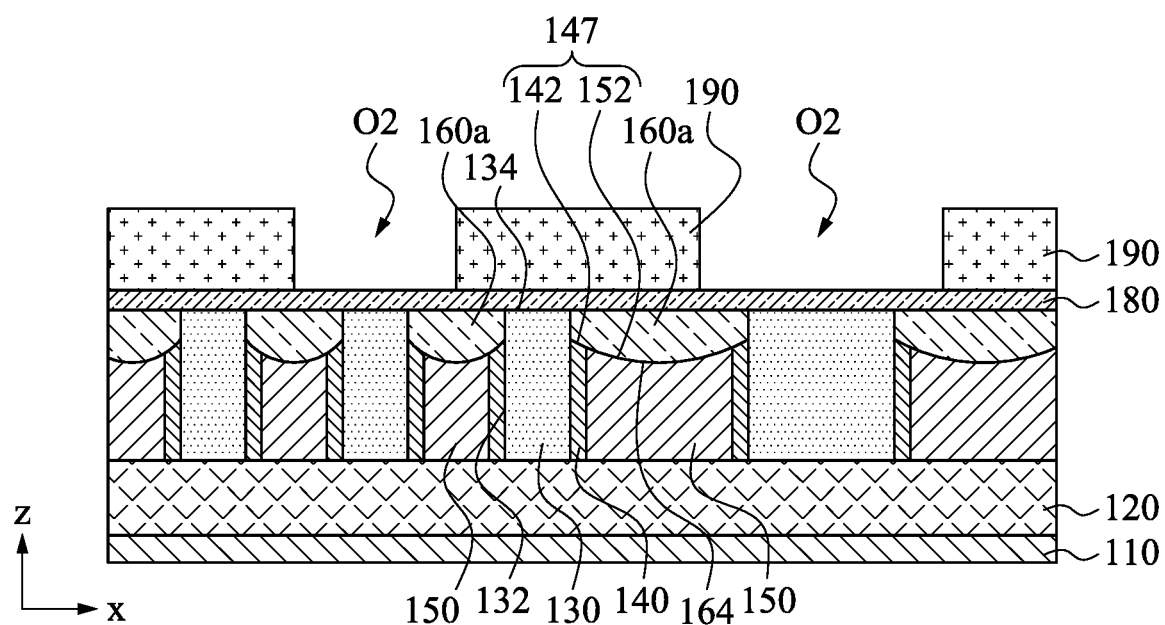
Figure 14A:
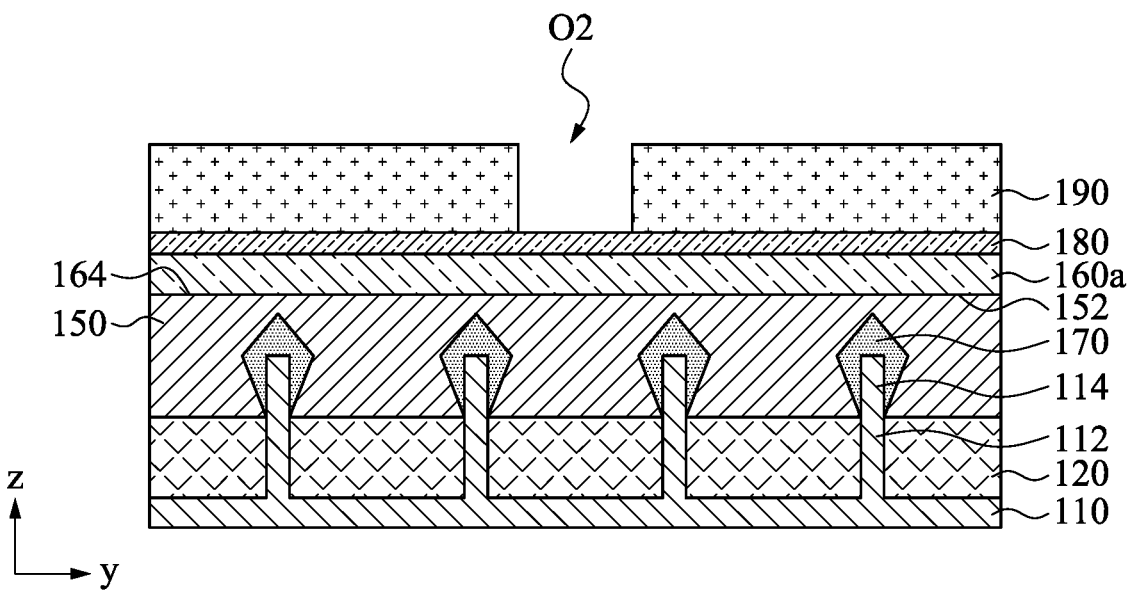
Figure 17:
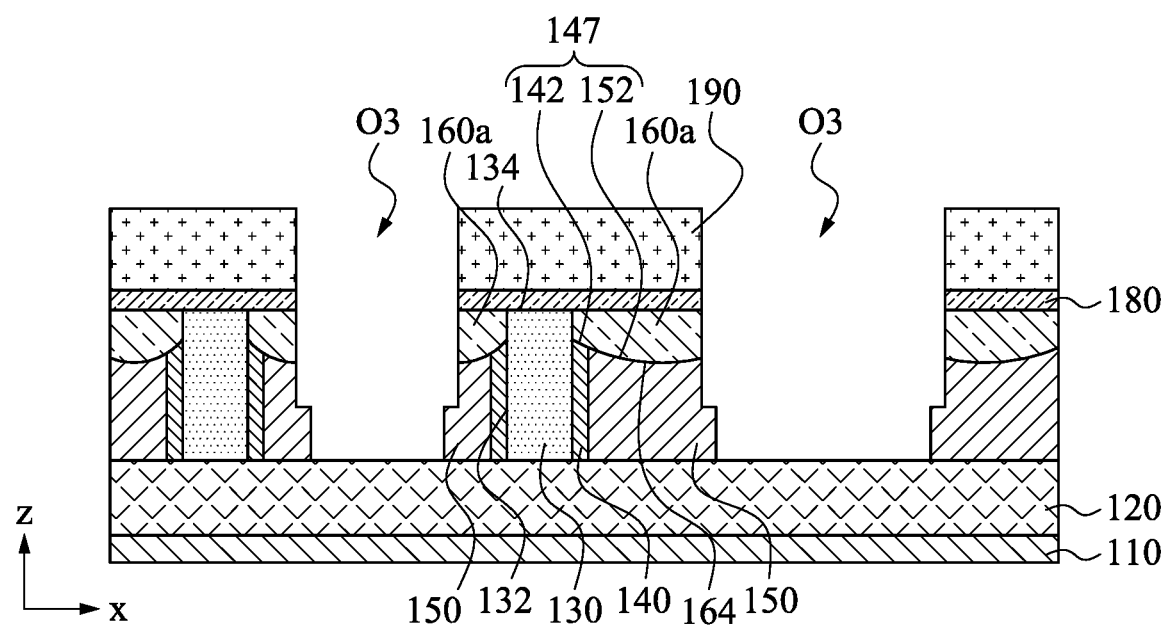
Figure 18A:
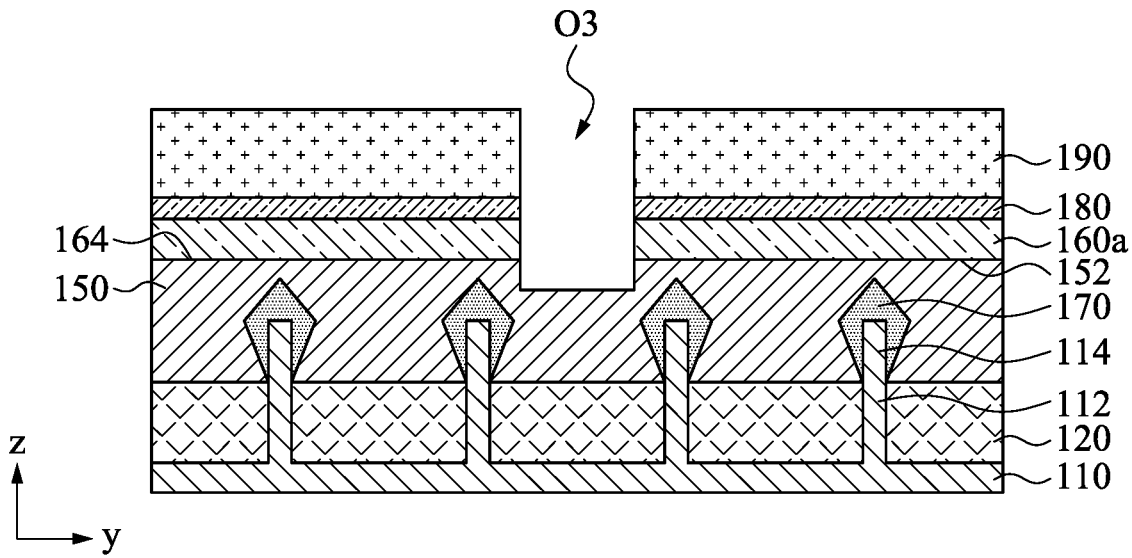
Figure 19:
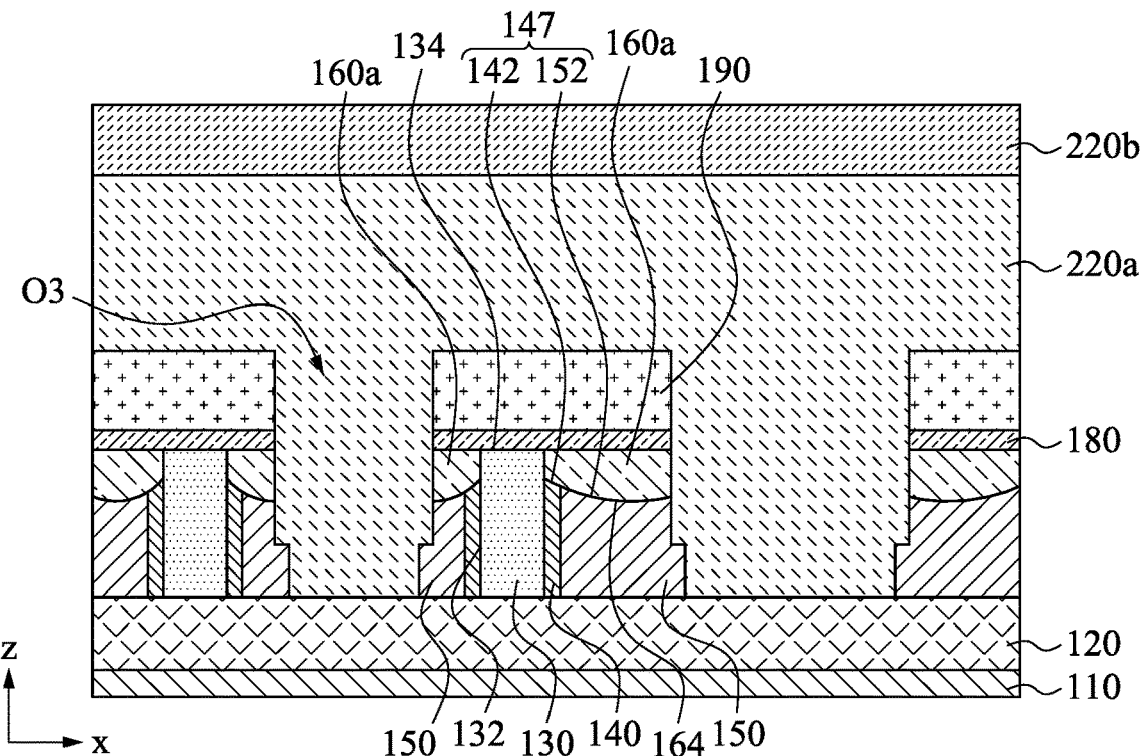
Figure 20:
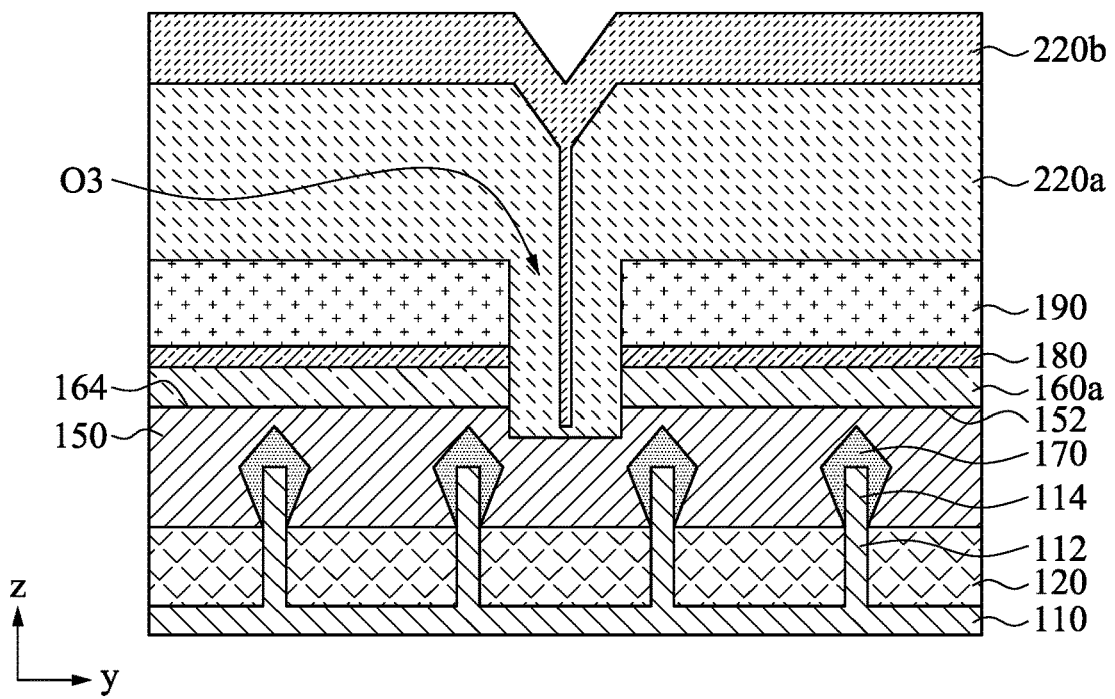
Figure 21:
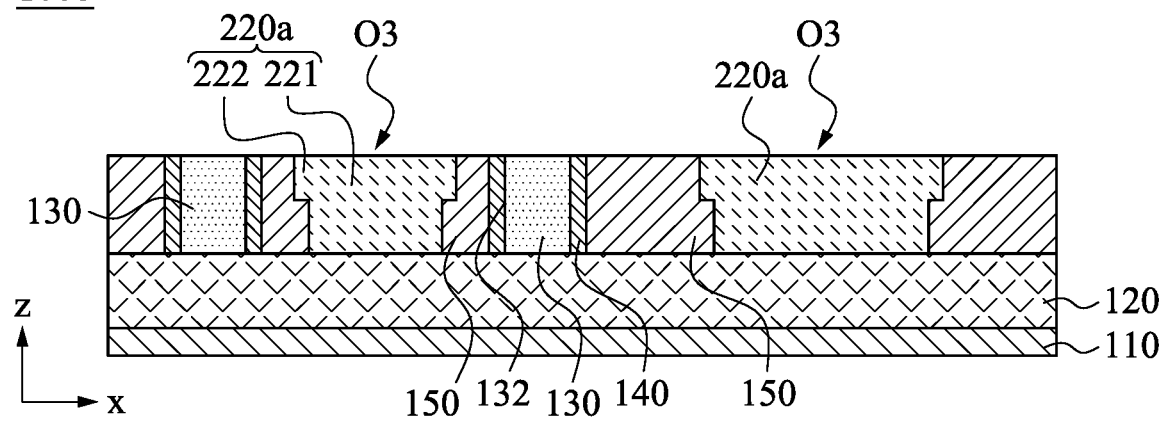
Figure 22:
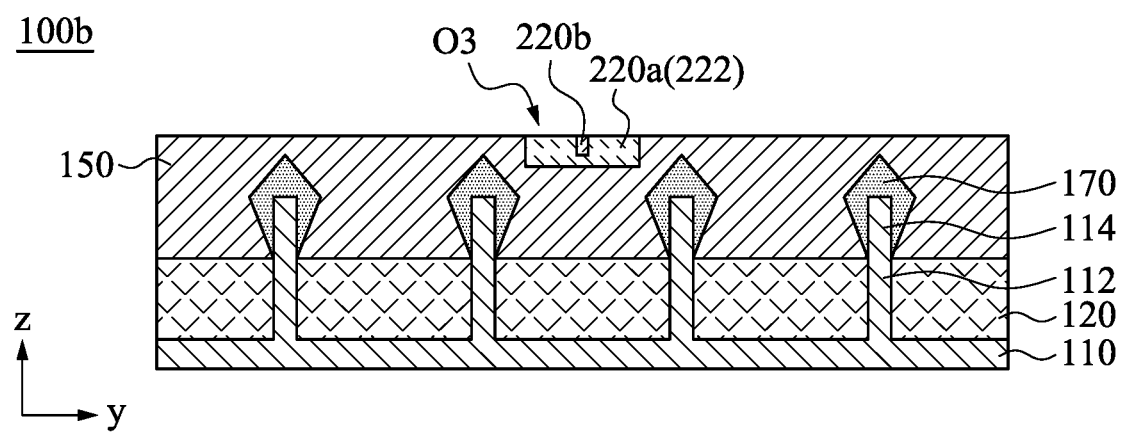

FIG. 1 is a flowchart of a method of forming a semiconductor structure in accordance with some embodiments of the present disclosure. The method begins with block 10 in which a metal gate stack 130, a gate spacer 140, and an interlayer dielectric 150 (ILD) are formed over a shallow trench isolation (STI) material 120 in a semiconductor substrate 110 (as shown in FIGS. 2 and 3). The method continues with block 20 in which the interlayer dielectric 150 is recessed to form a first concave surface 152 lower than the top surface 134 of the metal gate stack 130 (as shown in FIG. 4). The method continues with block 30 in which the gate spacer 140 is recessed to form a second concave surface 142 adjoining the first concave surface 152 of the interlayer dielectric 150 (as shown in FIG. 5). The method continues with block 40 in which a helmet layer 160 is formed over the metal gate stack 130, the first concave surface 152 of the interlayer dielectric 150, and the second concave surface 142 of the gate spacer 140 (as shown in FIG. 6). The method continues with block 50 in which the helmet layer 160 is polished until reaching metal gate stack 130 to form helmet structures 160a (as shown in FIGS. 7 and 8). The method continues with block 60 in which a patterned hard mask layer 190 is formed over the helmet structures 160a and the metal gate stack 130, and has an opening O2 above the metal gate stack 130 and the gate spacer 140 (as shown in FIGS. 13 and 14A). The method continues with block 70 in which the metal gate stack 130, the gate spacer 140, the hard mask layer 190, and the interlayer dielectric 150 below the opening O2 are removed to form another opening O3 (as shown in FIGS. 17 and 18A). The method continues with block 80 in which dielectric materials 220a and 220b are formed in the opening O3 and over remaining portions of the metal gate stacks 130 and the helmet structures 160a (as shown in FIGS. 19 and 20). The method continues with block 90 in which the dielectric materials 220a and 220b and the helmet structures 160a are polished until removing the helmet structures 160a (as shown in FIGS. 21 and 22).

FIG. 2 is a perspective view of a semiconductor device 100 in accordance with some embodiments of the present disclosure. FIG. 3 is a cross-sectional view of the semiconductor device 100 taken along line L1-L1 shown in FIG. 2. Referring to FIGS. 2 and 3, the semiconductor device 100 includes a semiconductor substrate 110 with protruding semiconductor fins 112, a shallow trench isolation (STI) material 120 between the fins 112, metal gate stacks 130 over the STI material 120 and the fins 112, gate spacers 140 adjacent to sidewalls 132 of the metal gate stacks 130, and an interlayer dielectric (ILD) 150 over the STI material 120 and the fins 112 not covered by the metal gate stacks 130 and the gate spacers 140. The metal gate stacks 130 and the gate spacers 140 are across the fins 112. The formation of the semiconductor device 100 includes forming the fins 112 from or on the semiconductor substrate 110, forming the STI material 120 in trenches between the fins 112, recessing the STI material, forming patterned dummy gate electrodes (not shown) over the STI material 120 and the fins 112, forming the gate spacers 140 on lateral sidewalls of the dummy gate electrodes, epitaxially growing a semiconductor material 170 over the upper portions 114 of fins 112, forming the interlayer dielectric 150 over the epitaxially-grown semiconductor material 170 and the STI material 120, removing the dummy gate electrodes to form openings between the gate spacers 140, and forming the metal gate stacks 130 in the openings. As a result, the semiconductor device 100 of FIG. 2 can be formed.

The semiconductor substrate 110 is recessed to form the fins 112, but various embodiments of the present disclosure are not limited in this regard. In some embodiments, the fins 112 are epitaxially-grown on the semiconductor substrate 110. The fins 112 and the semiconductor substrate 110 are formed from silicon, germanium, silicon germanium, one of the III-V compound semiconductors, or another semiconductor material. Upper portion of the STI material 120 is recessed such that upper portions 114 of the fins 112 protrude from, or extends above, the STI material 120. In some embodiments, the upper portions 114 are germanium (Ge), the remainders of the fins 112 are silicon germanium (SiGe), and the semiconductor substrate 110 is a silicon wafer. In alternative embodiments, the upper portions 114 and the remainders of the fins 112 are silicon germanium (SiGe). In yet other embodiments, the channel regions 114 are silicon (Si), and the remainders of the fins 112 are silicon germanium (SiGe).

The STI material 120 may include silicon oxide, silicon oxynitride, silicon nitride, low-k materials, or other suitable materials. The STI material 120 is formed using a high aspect ratio process (HARP), which may be an enhanced HARP (EHARP), but various embodiments of the present disclosure are not limited in this regard. In some embodiments, the STI material 120 is formed using other methods having good gap-filling ability, such as spin-on.

In some embodiments, the upper portions 114 are formed from silicon, and the dummy gate electrodes are formed from polysilicon, but various embodiments of the present disclosure are not limited in this regard. In some embodiments, the upper portions 114 are formed from germanium, the dummy gate electrodes are formed from polycrystalline germanium. The gate spacers 140 may be made of a material including silicon nitride, oxide, oxy-nitride or any combinations thereof. Each of the gate spacers 140 may include a single layer or a composite layer. The gate spacers 140 may be formed by blanket depositing a dielectric layer over the STI material 120 and the dummy gate electrodes using thermal process, low pressure chemical vapor deposition (LPCVD), or plasma enhanced chemical vapor deposition (PECVD), then anisotropically etching the dielectric material to remove the dielectric material from horizontal surfaces but not from the sidewalls of the dummy gate electrodes.

After the formation of the gate spacers 140, the semiconductor material 170 (i.e., epitaxial material or epitaxial structure) is epitaxially grown over the upper portions 114 of fins 112 that are free from coverage by the gates and gate spacers. The semiconductor material 170 may be in-situ doped with an n-type dopant or a p-type dopant during the epitaxy process in some embodiments. In other embodiments, an additional implantation process is performed to dope an n-type dopant or a p-type dopant into the epi-grown semiconductor material 170. In some embodiments, semiconductor material 170 is formed from silicon, silicon germanium, silicon carbon phosphorus, and so on. The semiconductor material 170 may include a single layer or multilayer structure. In the single-layer embodiment, the semiconductor material 170 may include a silicon-containing material. In some embodiments, the silicon-containing material includes silicon phosphorus (SiP), silicon carbon (SiC), or silicon germanium (SiGe). In some embodiments, the semiconductor material 170, such as silicon carbon (SiC), is epi-grown by a low pressure chemical vapor deposition (LPCVD) process to form source/drain regions of an n-type fin field-effect transistor (FinFET). In alternative embodiments, the semiconductor material 170, such as silicon germanium (SiGe), is epi-grown by a LPCVD process to form source/drain regions of a p-type FinFET. In the multilayer embodiments, the semiconductor material 170 may further include a II-VI semiconductor material or a III-V semiconductor material between the silicon-containing material and the upper portions 114 of the fins 112. In some embodiments, the II-VI semiconductor material includes a material selected from the group consisting of ZeSe, ZnO, CdTe, and ZnS. In some embodiments, the III-V semiconductor material includes a material selected from the group consisting of GaAs, InAs, InGaAs, AlAs, AlGaAs, InP, AlInP, InGaP, GaN, AlGaN, InN, InGaN, InSb, InGaAsSb, InGaAsN, and InGaAsP. In some embodiments, the semiconductor material 170, such as gallium arsenide (GaAs), is epi-grown by a metal-organic chemical vapor deposition (MOCVD) process.

The interlayer dielectric (ILD) 150 is formed over the semiconductor material 170 and the STI material 120. In some embodiments, the interlayer dielectric (ILD) 150 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The interlayer dielectric 150 may be formed using, for example, chemical vapor deposition (CVD), atomic layer deposition (ALD), spin-on-glass (SOG) or other suitable techniques.

The metal gate stacks 130 may include interfacial layers, high-k dielectric layers, capping layers, a material layer with a proper work function, conductive layers, other suitable layers, and/or combinations thereof. For example, the metal gate stacks 130 can include a conductive layer having a proper work function (therefore also referred to as a work function layer) and a conductive material layer formed on the work function layer. In various examples, the work function layer includes tantalum, tantalum nitride, nickel silicide, cobalt silicide, TiN, WN, TiAl, TiAlN, TaCN, TaC, TaSiN, other suitable material, or combination thereof. The conductive material layer formed on the work function layer includes a suitable conductive material, such as aluminum, tungsten, or copper. The conductive material layer may additionally or collectively include polysilicon, titanium, tantulum, metal alloys, other suitable materials, and/or combinations thereof. Subsequent to the formation of the metal gate stacks 130, a chemical-mechanical planarization (CMP) process may be performed to provide a substantially coplanar surface of the metal gate stacks 130, the gate spacers 140, and the interlayer dielectric 150.

FIGS. 4-7, 9, 11, 13, 15, 17, 19, and 21 are cross-sectional views of intermediate stages of forming a semiconductor structure taken along line L1-L1 of FIG. 2 after the stage of FIG. 3. Referring to FIG. 4, the interlayer dielectric 150 is then recessed to form first concave (e.g., dish-shaped) surfaces 152 lower than the top surfaces 134 of the metal gate stacks 130. Furthermore, the first concave surfaces 152 of the interlayer dielectric 150 are also lower than the tops of the gate spacers 140. In some embodiments, the interlayer dielectric 150 is recessed by an etching process with a non-plasma recipe, such as Certas® oxide etch, but various embodiments of the present disclosure are not limited in this regard. Certas® oxide etch is non-plasma gas etch, wherein the interlayer dielectric 150 has higher etch rate in the Certas® oxide etch process than that of the gate spacers 140 and the metal gate stack 130. Therefore, the interlayer dielectric 150 is recessed, while the gate spacers 140 and the metal gate stack 130 remain substantially intact. In some embodiments, the reaction gas in Certas® oxide etch is a gas mixture of HF and $NH_3$, which has no reaction with metal. In some embodiments, the non-plasma recipe of the etching process utilizes different $HF/NH_3$ gas ratios for the recess loading control of the interlayer dielectric 150, but various embodiments of the present disclosure are not limited in this regard. As a result, the etched interlayer dielectric 150 can have a spatially varied thickness and form the first concave surfaces 152 distal to the semiconductor substrate 110. The first concave surface 152 of the interlayer dielectric 150 has a concave parabolic contour with a lower central region and a higher peripheral region, for example.

Referring to FIG. 5, the gate spacers 140 are then recessed to form second concave surfaces 142 lower than the tops of the metal gate stacks 130. The second concave surfaces 142 are top surfaces of the gate spacers 140. The gate spacers 140 are pulled back to adjoin the first concave surfaces 152 of the interlayer dielectric 150. A pulled-back depth of the gate spacer 140 is in a range from about 0 nm to about 30 nm. If the pulled-back depth is not enough, the effective depth of the subsequently formed helmet structure 160a (e.g., YSiO) would decrease such that a process window in subsequent CMG (cut metal gate) etch of FIGS. 17 and 18A will be not enough. If the gate spacer 140 is pulled back too deeper, a subsequent CMP process of FIGS. 21 and 22 needs to polish more helmet structure 160a. The first concave surfaces 152 of the interlayer dielectric 150 and the second concave surfaces 142 of the gate spacers 140 can be in combination referred to as a concave surface 147. Moreover, the sidewalls 132 of the metal gate stack 130 are exposed due to the recessed gate spacers 140, and adjoin the second concave surfaces 142 of the gate spacer 140. In some embodiments, the gate spacers 140 are recessed by a remote plasma etching process. The remote plasma SiN etch is a dry etch like $H_3PO_4$ wet etch application, which has good selectivity of SiN to oxide and has no side effect of wet etch. In some embodiments, the interlayer dielectric 150 includes silicon oxide, the gate spacers 140 are made of silicon nitride. The gate spacers 140 have higher etch rate in the remote plasma etching than that of the interlayer dielectric 150. Therefore, the gate spacers 140 are recessed by the remote plasma etching process, while the interlayer dielectric 150 remain substantially intact. Etching the gate spacers 140 are performed using an etchant different from an etchant used in etching the interlayer dielectric 150. In some embodiments, the etching process utilizes a combination of $NF_3$ and $H_2$ gas as etchants for high selectivity between silicon nitride and silicon oxide, but various embodiments of the present disclosure are not limited in this regard. As a result, the etched gate spacers 140 can have a spatially varied thickness and form the second concave surfaces 142 distal to the semiconductor substrate 110. The second concave surfaces 142 of the gate spacers 140 have lower regions adjacent to the interlayer dielectric 150 and higher regions adjacent to the metal gate stacks 130.

Referring to FIG. 6, a helmet layer 160 is formed over the first concave surfaces 152 of the interlayer dielectric 150, the second concave surfaces 142 of the gate spacers 140, and the metal gate stacks 130. The helmet layer 160 is in contact with the sidewalls 132 of the metal gate stacks 130. The helmet layer 160 is non-conformally formed over the first concave surfaces 152 of the interlayer dielectric 150 and the second concave surfaces 142 of the gate spacers 140. Such a non-conformal formation of the helmet layer 160 makes top and bottom surfaces 162 and 164 thereof have different geometries. In some other embodiments, the helmet layer 160 is non-conformally formed by suitable depositing techniques, such as chemical vapor deposition (CVD) or atomic layer deposition (ALD), to deposit a layer thick enough such that its top surface 162 has less curvature than its bottom surface 164. The helmet layer 160 and the interlayer dielectric 150 are made of different materials. In some embodiments, the helmet layer 160 may be made of a material including titanium nitride (TiN), tantalum nitride (TaN), or yttrium silicate (YSiOx), but various embodiments of the present disclosure are not limited in this regard. In addition, the thickness of the helmet layer 160 is in a range from about 18 nm to about 30 nm.

Referring to FIG. 7, after the formation of the helmet layer 160, the helmet layer 160 is polished from its top surface 162 until reaching the metal gate stacks 130. As a result, remaining portions of the helmet layer 160 are respectively formed over the concave surfaces 147. The remaining portions of the helmet layer 160 are referred to as helmet structures 160a. In some embodiments, the helmet layer 160 is polished using a chemical-mechanical planarization (CMP) process, but various embodiments of the present disclosure are not limited in this regard. After the CMP process of FIG. 7, the thickness of the helmet structure 160a is in a range from about 8 nm to about 22 nm. If the helmet structure 160a (e.g., YSiO) is too thick, it is a burden for the CMP process of FIGS. 21 and 22 because thicker helmet structure 160a needs to be polished. If the helmet structure 160a is too shallow, there is not enough helmet structure 160a for protect the interlayer dielectric 150 against the subsequent CMG (cut metal gate) etch of FIGS. 17 and 18A. The helmet structures 160a are in contact with the sidewalls 132 of the metal gate stacks 130. Stated differently, the sidewalls 132 of the metal gate stacks 130 not covered by the gate spacers 140 form interfaces with the helmet structures 160a. Furthermore, the concave surfaces 147 defined by top surfaces of the gate spacers 140 and the interlayer dielectric 150 are in contact with the helmet structures 160a. In other words, the helmet structures 160a have convex surfaces (i.e., the bottom surfaces 164) conformal over the top surfaces of the gate spacers 140 (i.e., the second concave surfaces 142) and the top surfaces of the interlayer dielectric 150 (i.e., the first concave surfaces 152). Therefore, the helmet structure 160a has the bottom surface 164 with a slope that increases as the thickness of the helmet layer 160 decreases. In addition, after the helmet layer 160 is polished using the CMP process, the top surfaces 134 of the metal gate stacks 130 distal to the semiconductor substrate 110 are substantially flush with the top surfaces 162 of the helmet structures 160a. As a result, the helmet structure 160a has a thickness that increases as a thickness of the interlayer dielectric 150 decreases, and has a thickness that increases as a thickness of the gate spacer 140 decreases.

Figure 14B:
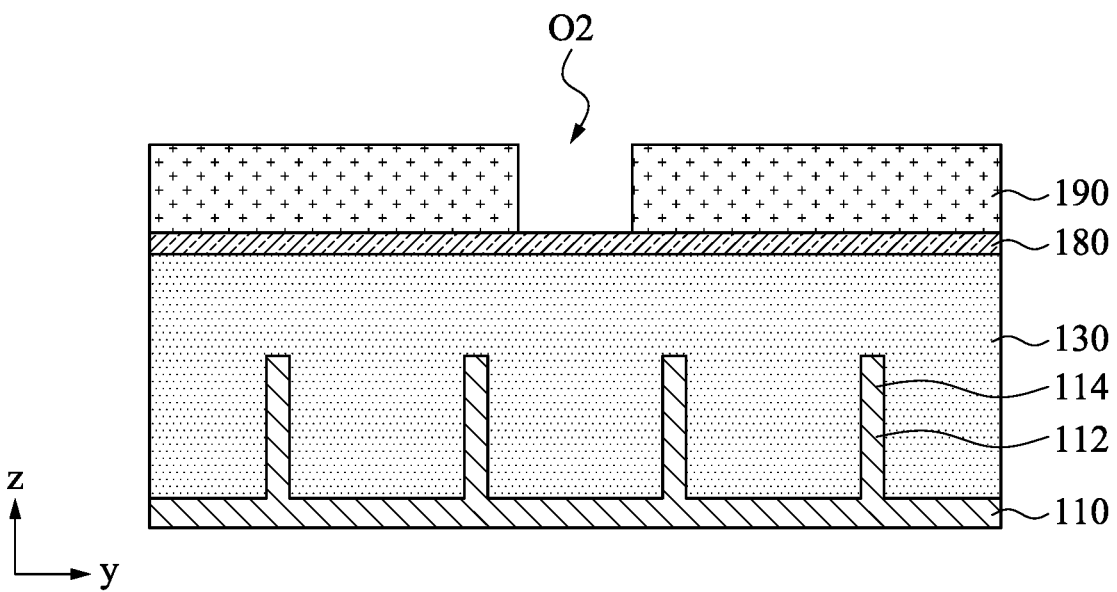
FIGS. 14B, 16B, and 18B are cross-sectional views of intermediate stages of forming a semiconductor structure taken along line L3-L3 of FIG. 2 after the stage of FIG. 12.
Figure 18B:
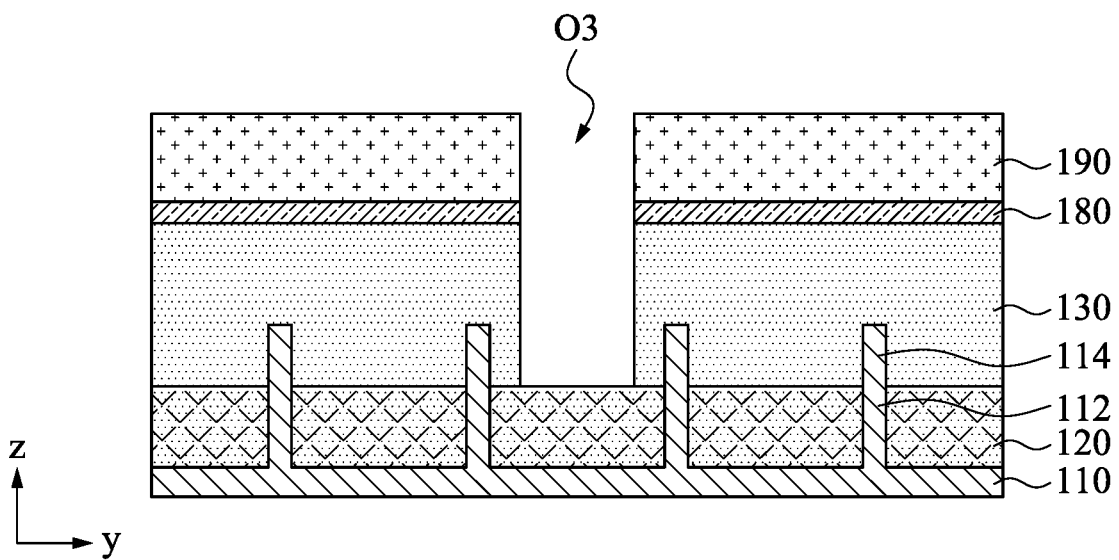

FIGS. 8, 10, 12, 14A, 16A, 18A, 20, and 22 are cross-sectional views of intermediate stages of forming a semiconductor structure taken along line L2-L2 of FIG. 2 after the stage of FIG. 6. FIGS. 14B, 16B, and 18B are cross-sectional views of intermediate stages of forming a semiconductor structure taken along line L3-L3 of FIG. 2 after the stage of FIG. 12. It is to be noted that the stages of FIGS. 8, 10, 12, 14A, 16A, 18A, 20, and 22 are respectively correspond to the stages of FIGS. 7, 9, 11, 13, 15, 17, 19, and 21, and the stages of FIGS. 14B, 16B, and 18B are respectively correspond to the stages of 14A, 16A, 18A. Referring to FIG. 8, the helmet structure 160a is formed over the interlayer dielectric 150, and overlaps the upper portions 114 of fins 112 with the epitaxially-grown semiconductor material 170. In other words, the helmet structure 160a covers the source/drain regions. After the helmet layer 160 is polished to form the helmet structures 160a, a semiconductor structure 100a shown in FIGS. 7 and 8 can be obtained.

Figure 9:
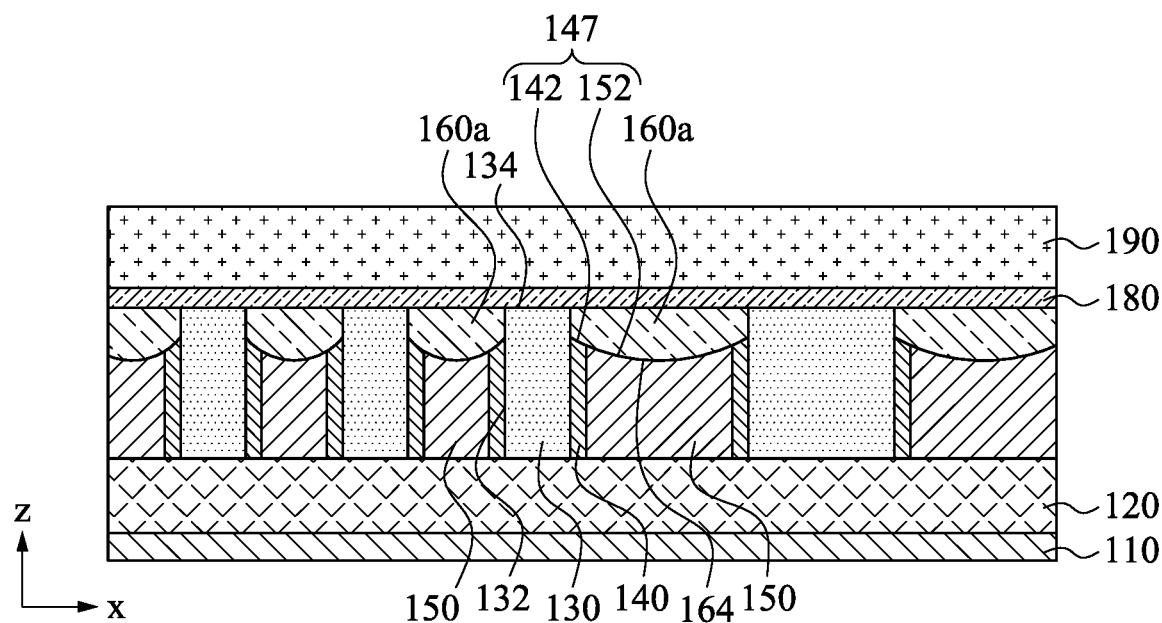
Figure 10:
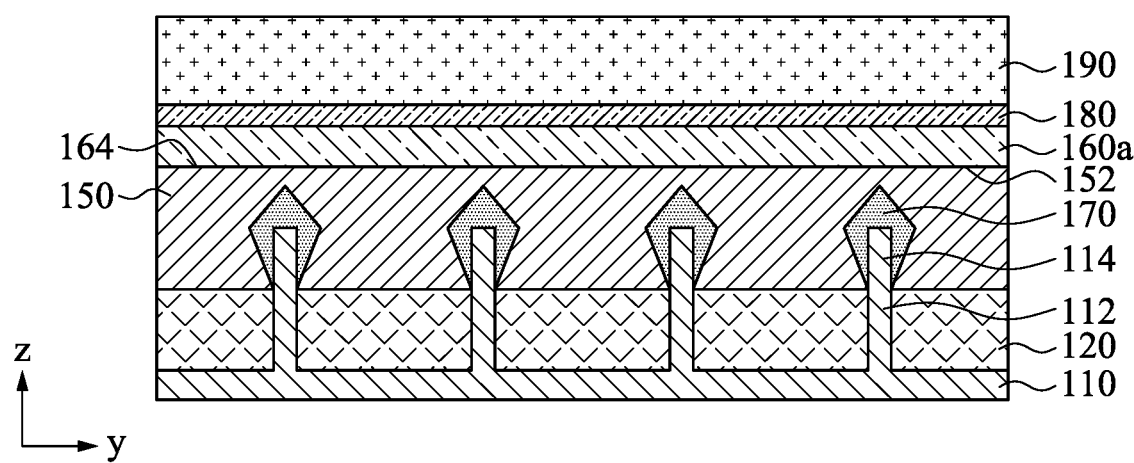

Referring to FIGS. 9 and 10, after the formation of the helmet structures 160a, a hard mask layer 190 is formed over the helmet structures 160a and the metal gate stacks 130a. The hard mask layer 190 may be deposited by chemical vapor deposition (CVD), physical vapor deposition (PVD), and/or other proper techniques. Moreover, in some embodiments, a buffer layer 180 is optionally formed under the hard mask layer 190. The hard mask layer 190 may be formed of silicon nitride, the buffer layer 180 may be formed of titanium nitride (TiN), but various embodiments of the present disclosure are not limited in this regard. For example, the hard mask layer 190 may be formed of silicon carbide, silicon oxynitride, or other suitable material.

Figure 11:
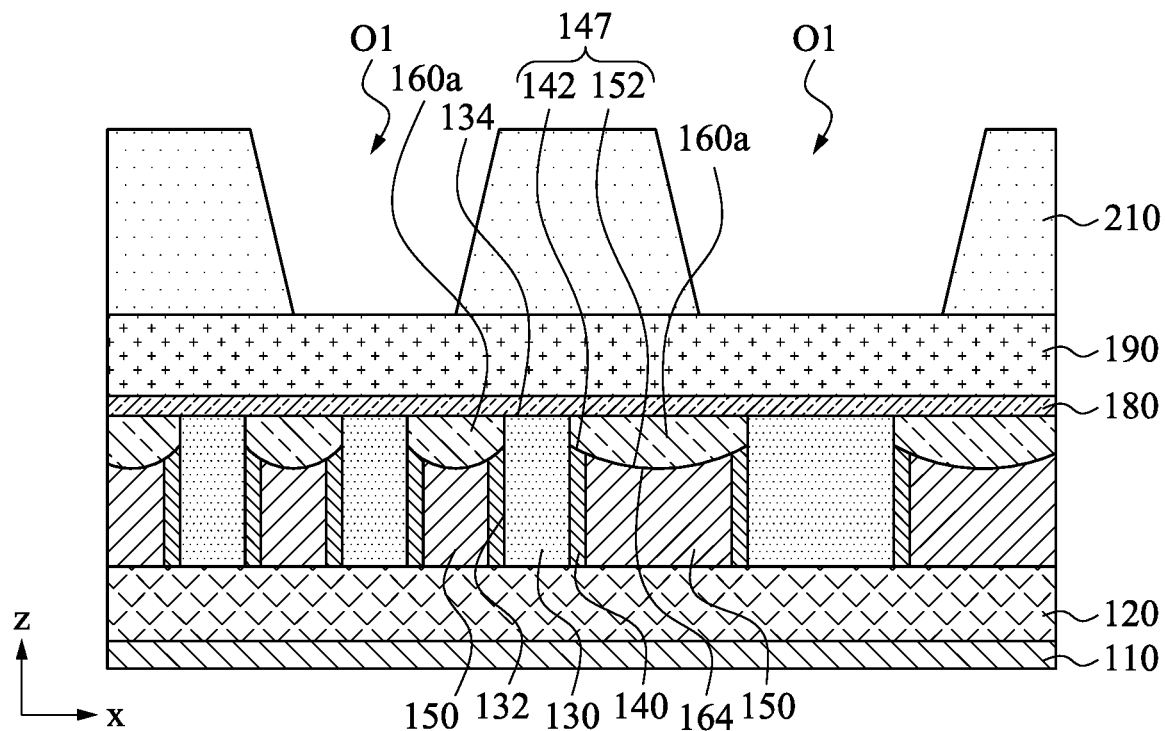
Figure 12:
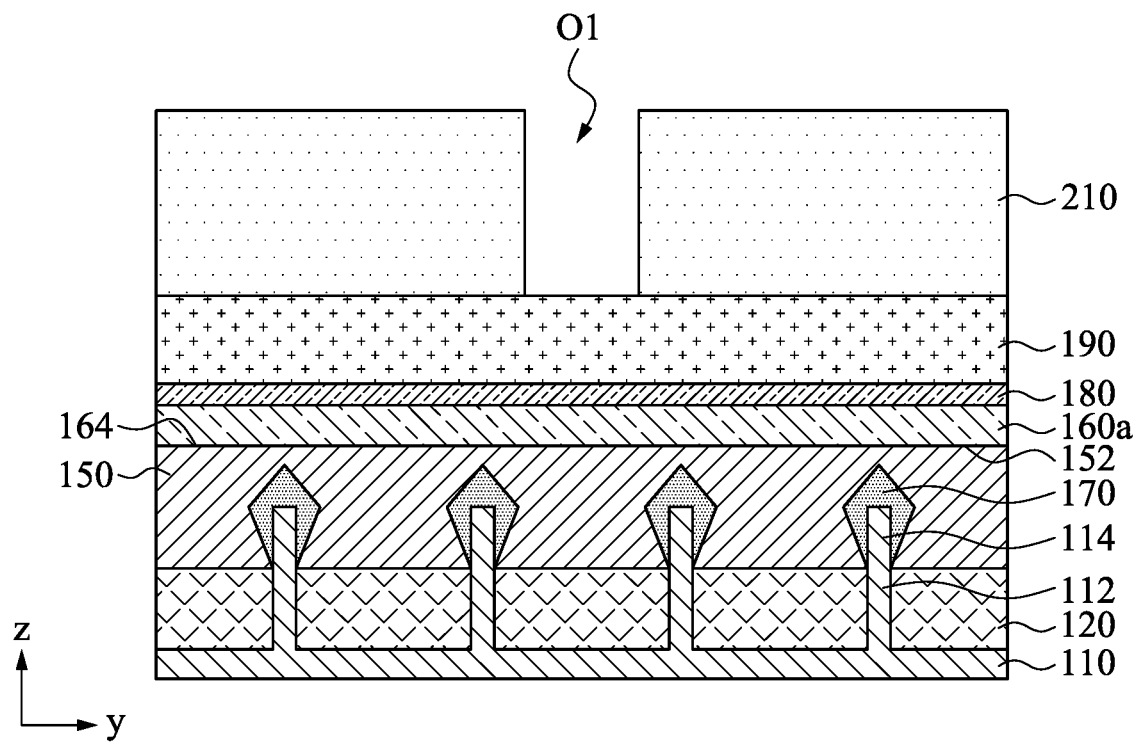

Next, referring to FIGS. 11 and 12, a photoresist layer 210 is formed over the hard mask layer 190, and then the photoresist layer 210 is patterned to form openings O1 above the metal gate stacks 130 and the gate spacers 140. Moreover, the opening O1 of the photoresist layer 210 is formed above a position that is between two of the upper portions 114 of fins 112. In some embodiments, the photoresist layer 210 is patterned using extreme ultraviolet (EUV) photolithography techniques, but various embodiments of the present disclosure are not limited in this regard. As a result, portions of the hard mask layer 190 are exposed through the openings O1 of the photoresist layer 210.

Referring to FIGS. 13 and 14A, the portions of the hard mask layer 190 exposed through the openings O1 are removed, such that the hard mask layer 190 is patterned to form openings O2 above the metal gate stacks 130 with the gate spacers 140. Furthermore, the openings O2 are also above the helmet structures 160a and the interlayer dielectric 150. Next, the photoresist layer 210 is removed. Portions of the buffer layer 180 are exposed through the openings O2. In some embodiments, the photoresist layer 210 is removed by wet stripping and/or plasma ashing, but various embodiments of the present disclosure are not limited in this regard. In addition, the openings O2 may be also shown in FIG. 14B in different cross section.

Figure 15:
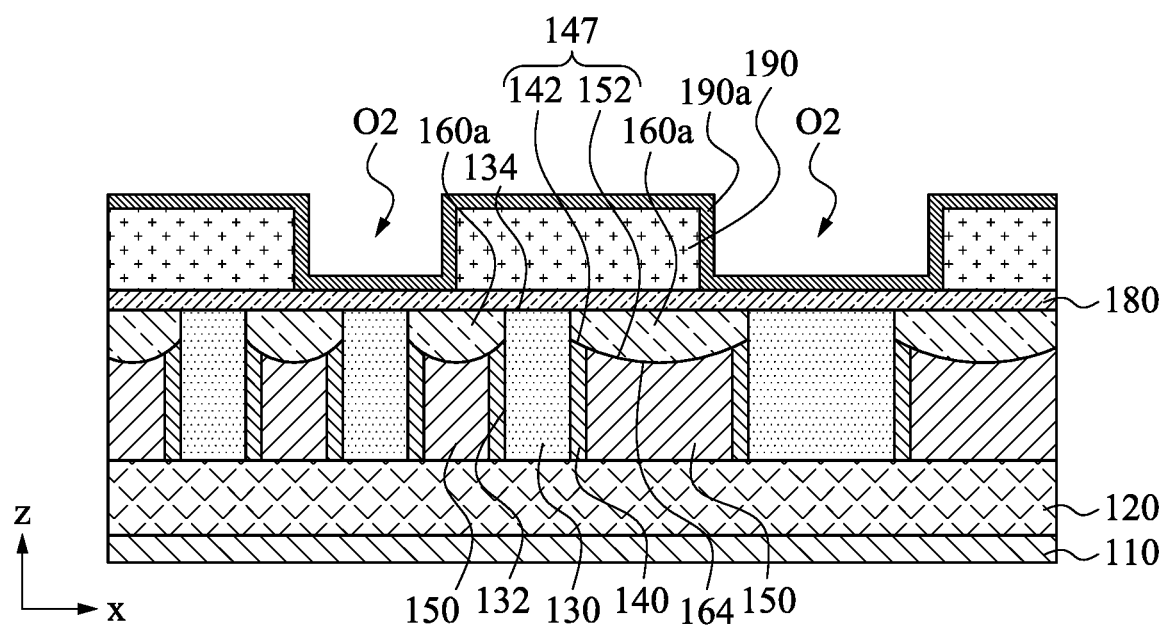
Figure 16A:
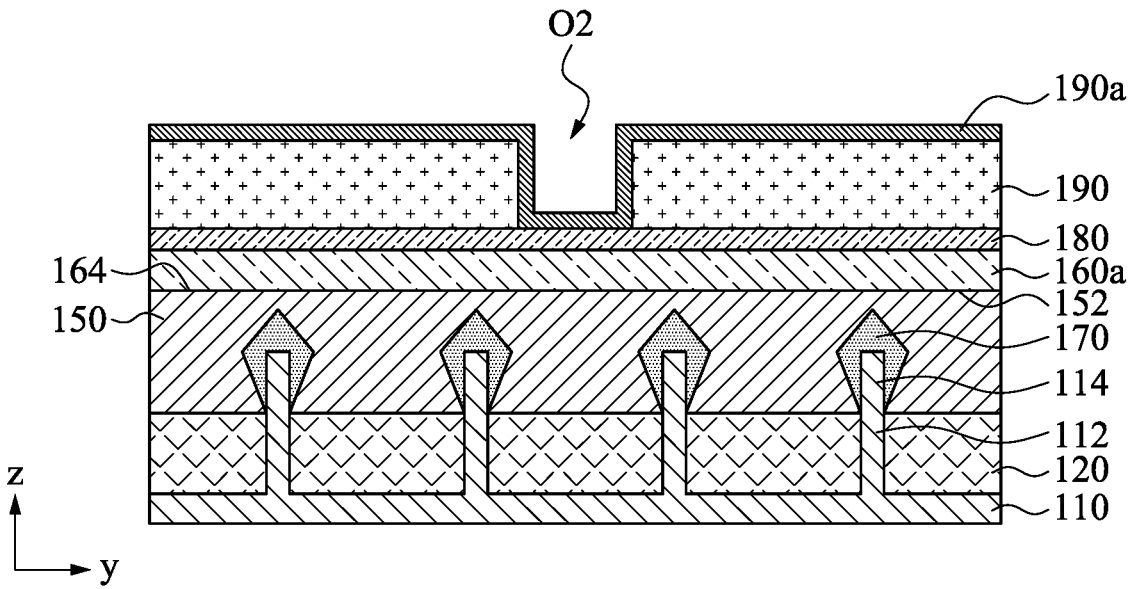
Figure 16B:
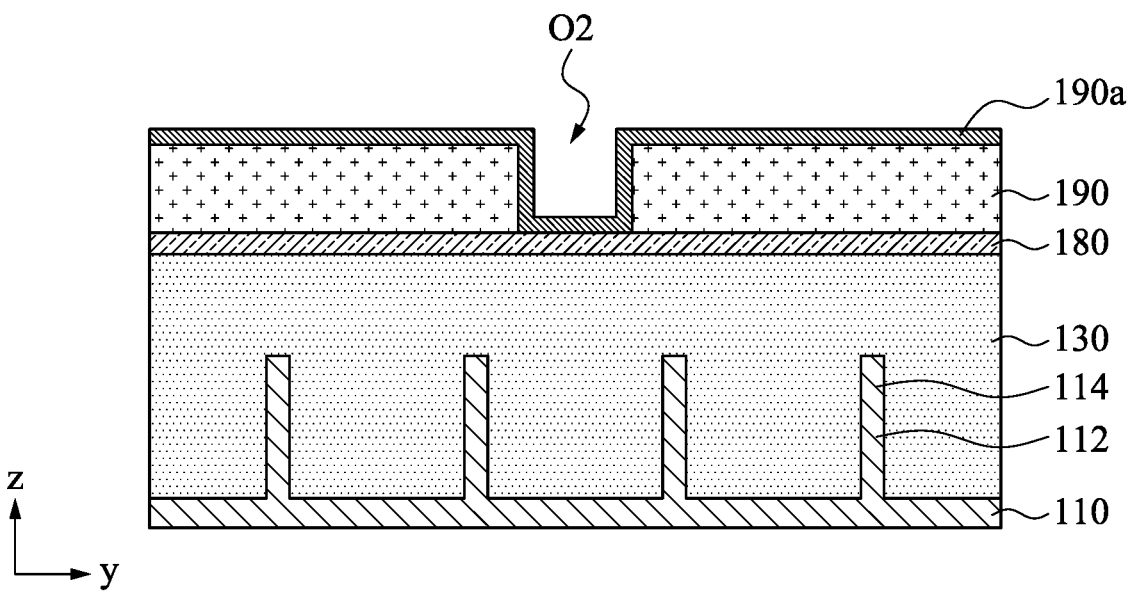

Referring to FIGS. 15 and 16A, after the openings O1 of the hard mask layer 190 are formed, a capping layer 190a is optionally formed over the hard mask layer 190 and the buffer layer 180 in the openings O2. The capping layer 190a and the hard mask layer 190 may be made of the same material. For example, the capping layer 190a is formed from silicon nitride, but various embodiments of the present disclosure are not limited in this regard. In addition, the capping layer 190a may be also shown in FIG. 16B in different cross section.

Next, referring to FIG. 17, portions of the metal gate stacks 130 and adjacent portions of the gate spacers 140 under the openings O2 are removed to form openings O3, and hence portions of the STI material 120 and the interlayer dielectric 150 are exposed through the openings O3. In this way, the metal gate stacks 130 can be cut, and thus this step can be referred to as a cut metal gate (CMG) process as well. The removal of the portions of the metal gate stacks 130 and the portions of the gate spacers 140 includes removing the capping layer 190a, the buffer layer 180, the helmet structures 160a, and the gate spacers 140 that are below the openings O2 of the hard mask layer 190 using one or more etching processes.

FIG. 18A is another cross-sectional view of the stage of FIG. 17. After the metal gate stacks 130 with the gate spacers 140 are selectively removed, the helmet structures 160a and the interlayer dielectric 150 below the opening O2 of the hard mask 190 (see FIG. 16A) and adjacent to the removed metal gate stacks 130 are also etched, and the opening O3 is formed in the helmet structure 160a and the underlying interlayer dielectric 150. In some embodiments, the opening O3 may extend to a position between the epitaxially-grown semiconductor material 170 respectively on two of the upper portions 114 of fins 112, while the semiconductor material 170 remain covered by the interlayer dielectric 150, not exposed by the opening O3. In other words, the entirety of the epitaxial material (i.e., the semiconductor material 170) is covered by the interlayer dielectric 150 after etching the metal gate stacks 130. In addition, the opening O3 may be also shown in FIG. 18B in different cross section.

The helmet structures 160a have higher etch resistance to etching the metal gate stacks 130 than that of the interlayer dielectric 150. Since the helmet structures 160a are formed over the first concave surfaces 152 of the interlayer dielectric 150 and the second concave surfaces 142 of the gate spacers 140 (see FIG. 15), the loss of the interlayer dielectric 150 (ILD loss) in cutting the metal gate stacks 130 can be reduced to smaller than 5 nm, such as 4.7 nm. In other words, the loss of the interlayer dielectric 150 can be reduced by the helmet structures 160a, and the depth of the opening O3 can be precisely controlled. As a result, the process window of cutting the metal gate stack 130 can be expanded due to the reduced loss of the interlayer dielectric 150. Moreover, when the loss of the interlayer dielectric 150 is reduced or the process window of cutting the metal gate stack 130 is expanded, an issue for the damage of the epitaxially-grown semiconductor material 170 can be prevented when forming the opening O3. In some embodiments, the reduced depth of the opening O3 results in a bottom of the opening O3 at a height not lower than tops of the upper portions 114 of the fins 112. For example, the bottom of the opening O3 may be at a height above tops of the fins 112.

Referring to FIGS. 19 and 20, after the portions of the metal gate stacks 130 with the gate spacers 140 are cut to form the openings O3, a dielectric material 220a is formed in the opening O3 and over remaining portions of the metal gate stacks 130 and the helmet structures 160a (or the buffer layer 180), and then another dielectric material 220b is sequentially formed in the opening O3 and over the dielectric material 220a. In some embodiments, the dielectric material 220a and the hard mask layer 190 (see FIG. 17) are made of the same material. The number of the dielectric material shown in FIG. 19 is for illustration, and various embodiments of the present disclosure are not limited in this regard. In some embodiments, the dielectric materials 220a and 220b are non-conformally formed in the opening O3. For example, a spin-on coating process may be performed to fill the openings O3 with the dielectric materials 220a and 220b. In some embodiments, the dielectric materials 220a and 220b are formed from silicon nitride. In other embodiments, silicon oxide, oxynitride, or other suitable dielectric materials may also be used to form the dielectric materials 220a and 220b. In some embodiments, the dielectric materials 220a and 220b may be deposited by chemical vapor deposition (CVD), physical vapor deposition (PVD), and/or other suitable techniques.

As a result of deposition of dielectric material(s), the openings O3 are filled with the dielectric material 220a, and portions of the dielectric materials 220a and 220b may be located between the epitaxially-grown semiconductor material 170 respectively on two of the upper portions 114 of fins 112.

Referring to FIGS. 21 and 22, after the formation of the dielectric materials 220a and 220b, a chemical-mechanical planarization (CMP) process is performed. The dielectric materials 220a and 220b and the helmet structures 160a are polished until removing the helmet structures 160a and reaching the interlayer dielectric 150. As a result, remaining portions of the dielectric materials 220a and 220b in the openings O3 are exposed from the interlayer dielectric 150. The dielectric material 220b is located in the dielectric material 220a. Moreover, the dielectric material 220a is between the dielectric material 220b and the interlayer dielectric 150. After the aforementioned CMP process, a semiconductor device 100b shown in FIGS. 21 and 22 can be obtained. As shown in FIG. 21, the dielectric material 220a is a dielectric structure having a first portion 221 and a second portion 222. The first portion 221 of the dielectric structure 220a is between two of the metal gate stacks 130. The second portion 222 of the dielectric structure 220a extends from the first portion 221, and is embedded in the interlayer dielectric 150. The first portion 221 of the dielectric structure 220a has a bottom at a height lower than a bottom of the second portion 222 of the dielectric structure 220a, and a height difference between the bottom of the first portion 221 and the bottom of the second portion 222 is in a range from about 10 nm to about 70 nm. Moreover, as shown in FIG. 22, the second portion 222 of the dielectric structure 220a has a bottom at a height not lower than the tops of the semiconductor fins 112. In some embodiments, the bottom of the second portion 222 of the dielectric structure 220a is at a height higher than the tops of the semiconductor fins 112.

The semiconductor device 100b may undergo further CMOS or MOS technology processing to form various features and regions known in the art. For example, subsequent processing may form various contacts/vias/lines and multilayers interconnect features (e.g., metal layers and interlayer dielectrics) over the semiconductor substrate 110, configured to connect the various features or structures of fin field-effect transistors (FinFETs). For example, a multilayer interconnection includes vertical interconnects, such as conventional vias or contacts, and horizontal interconnects, such as metal lines. The various interconnection features may implement various conductive materials including copper, tungsten, and/or silicide.

In the aforementioned method of forming a semiconductor structure, the helmet structures formed is formed over the concave surface defined by the interlayer dielectric and the gate spacer. Therefore, when the wafer undergoes a CMG process, the height loss of the interlayer dielectric (ILD) can be reduced, which in turn leads to a smaller opening in the ILD resulting from the CMG process, which in turn prevents the epitaxy source/drain material from damaged by the CMG process. As a result, the process window of the CMP process can be expanded due to the reduced height loss of the ILD.

According to some embodiments, a method of forming a semiconductor device includes removing a top portion of a dielectric layer surrounding a metal gate to form a recess in the dielectric layer; filling the recess with a capping structure; forming a patterned hard mask over the capping structure and over the metal gate, wherein a portion of the metal gate, a portion of the capping structure, and a portion of the dielectric layer are aligned vertically with an opening of the patterned hard mask; and performing an etch process on said portions of the metal gate, the capping structure, and the dielectric layer that are aligned vertically with the opening of the patterned hard mask, wherein an etch resistance of the capping structure is higher than an etch resistance of the dielectric layer during the etch process.

According to some embodiments, a method of forming a semiconductor device includes removing a top portion of a dielectric layer surrounding a metal gate to form a recess in the dielectric layer; filling the recess with a capping structure; forming a patterned hard mask over the capping structure and over the metal gate, wherein a portion of the metal gate and a portion of the capping structure are aligned vertically with a first opening in the patterned hard mask; etching at least said portions of the metal gate and the capping structure that are aligned vertically with the first opening to form a second opening having a stepped sidewall; and filling the second opening with a dielectric material.

According to some embodiments, a semiconductor device includes the semiconductive fin, an isolation structure, a metal gate, source and drain structures, an interlayer dielectric layer, and a dielectric structure. The isolation structure surrounds a bottom portion of the semiconductive fin. The metal gate is over the semiconductive fin and over the isolation structure. The source and drain structures are on opposite sides of the metal gate and adjoin the semiconductive fin. The interlayer dielectric layer surrounds the metal gate. The dielectric structure has a first portion in the metal gate and a second portion in the interlayer dielectric layer, wherein a bottom of the first portion of the dielectric structure is lower than a bottom of the second portion of the dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   etching a dielectric layer surrounding a metal gate stack to form a recess in the dielectric layer;
   filling the recess with a capping structure;
   forming a patterned hard mask over the capping structure and over the metal gate stack, wherein a portion of the metal gate stack, a portion of the capping structure, and a portion of the dielectric layer are aligned vertically with a first opening in the patterned hard mask; and
   performing an etch process on said portions of the metal gate stack, the capping structure, and the dielectric layer that are aligned vertically with the first opening, wherein an etch resistance of the capping structure is higher than an etch resistance of the dielectric layer during the etch process.

2. The method of claim 1, wherein the etch process is performed to form a second opening having a stepped sidewall.

3. The method of claim 2, further comprising:
   filling the second opening having the stepped sidewall with a dielectric material.

4. The method of claim 3, wherein filling the second opening having the stepped sidewall with the dielectric material is performed such that a top surface of the dielectric material has a portion lower than a bottom surface of the capping structure.

5. The method of claim 3, further comprising:
   polishing the dielectric material, the patterned hard mask, the capping structure, and the dielectric layer at least until the capping structure is removed.

6. The method of claim 3, wherein the dielectric material comprises silicon nitride.

7. The method of claim 1, further comprising:
   etching a gate spacer alongside the metal gate stack such that a top of the gate spacer is lower than a top of the metal gate stack after etching the gate spacer.

8. The method of claim 7, wherein etching the gate spacer is performed such that a portion of a sidewall of the metal gate stack is exposed, and filling the recess with the capping structure is performed such that the capping structure is in contact with the exposed portion of the sidewall of the metal gate stack.

9. The method of claim 8, wherein etching the gate spacer is performed such that the top of the gate spacer is higher than a top of the dielectric layer after etching the gate spacer.

10. The method of claim 8, wherein etching the gate spacer is performed subsequent to etching the dielectric layer.

11. A method, comprising:
    removing a top portion of a dielectric layer surrounding a metal gate stack to form a recess in the dielectric layer;
    filling the recess with a capping structure;
    forming a patterned hard mask over the capping structure and over the metal gate stack, wherein a portion of the metal gate stack and a portion of the capping structure are aligned vertically with a first opening in the patterned hard mask;
    etching at least said portions of the metal gate stack and the capping structure that are aligned vertically with the first opening to form a second opening having a stepped sidewall; and
    filling the second opening with a dielectric material.

12. The method of claim 11, wherein filling the second opening with the dielectric material is performed such that a bottom portion of the dielectric material is narrower than a top portion of the dielectric material.

13. The method of claim 11, wherein the capping structure comprises titanium nitride, tantalum nitride, or yttrium silicate.

14. The method of claim 11, further comprising:
    prior to filling the recess with the capping structure, removing a top portion of a gate spacer alongside the metal gate stack such that the recess extends to a sidewall of the metal gate stack.

15. The method of claim 11, wherein removing the top portion of the dielectric layer is performed such that the dielectric layer has a concave top surface after removing the top portion of the dielectric layer.

16. A method, comprising:
    forming a shallow trench isolation (STI) material between fins;
    forming an interlayer dielectric over the STI material;
    forming a metal gate stack and a gate spacer over the STI material and across the fins;
    recessing the interlayer dielectric; and
    after recessing the interlayer dielectric, etching the gate spacer such that a top of the gate spacer is higher than a top of the interlayer dielectric and lower than a top of the metal gate stack.

17. The method of claim 16, wherein etching the gate spacer is performed such that the top of the gate spacer extends from the top of the interlayer dielectric to a sidewall of the gate spacer.

18. The method of claim 16, further comprising:
    forming a capping structure over the top of the gate spacer and the top of the interlayer dielectric.

19. The method of claim 18, further comprising:
    forming a patterned hard mask over the capping structure and the metal gate stack, wherein the patterned hard mask has a first opening vertically aligned with a portion of the metal gate stack; and
    etching said portion of the metal gate stack to form a second opening, wherein the interlayer dielectric has a stepped sidewall surrounds the second opening.

20. The method of claim 19, further comprising:
    filling the second opening with a dielectric material such that a top portion of the dielectric material is wider than a bottom portion of the dielectric material.

* * * * *